United States Patent
Nakayama et al.

(10) Patent No.: US 9,941,415 B2
(45) Date of Patent: Apr. 10, 2018

(54) OXIDE SINTERED BODY, SPUTTERING TARGET, AND OXIDE SEMICONDUCTOR THIN FILM OBTAINED USING SPUTTERING TARGET

(71) Applicant: SUMITOMO METAL MINING CO., LTD., Tokyo (JP)

(72) Inventors: Tokuyuki Nakayama, Ome (JP); Eiichiro Nishimura, Ome (JP); Fumihiko Matsumura, Ome (JP); Masashi Iwara, Ome (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 28 days.

(21) Appl. No.: 15/306,915

(22) PCT Filed: May 20, 2015

(86) PCT No.: PCT/JP2015/064527
§ 371 (c)(1),
(2) Date: Oct. 26, 2016

(87) PCT Pub. No.: WO2015/178429
PCT Pub. Date: Nov. 26, 2015

(65) Prior Publication Data
US 2017/0092780 A1 Mar. 30, 2017

(30) Foreign Application Priority Data
May 23, 2014 (JP) ................. 2014-107148

(51) Int. Cl.
H01L 29/12 (2006.01)
H01L 29/786 (2006.01)
C04B 35/03 (2006.01)
C23C 14/34 (2006.01)
C23C 14/08 (2006.01)
H01L 29/24 (2006.01)
H01L 21/02 (2006.01)
H01L 29/66 (2006.01)

(52) U.S. Cl.
CPC ........ *H01L 29/78693* (2013.01); *C04B 35/03* (2013.01); *C23C 14/082* (2013.01); *C23C 14/34* (2013.01); *H01L 21/02565* (2013.01); *H01L 21/02592* (2013.01); *H01L 21/02631* (2013.01); *H01L 29/24* (2013.01); *H01L 29/66969* (2013.01)

(58) Field of Classification Search
CPC ......... H01L 29/78693; H01L 29/66969; H01L 21/02565; H01L 21/02631; C23C 14/08; C23C 14/081; C23C 14/082; C23C 14/34
USPC ........................................................ 257/43
See application file for complete search history.

(56) References Cited

U.S. PATENT DOCUMENTS

| 8,795,554 B2 * | 8/2014 | Yano ................. C04B 35/01 204/298.13 |
| 2007/0184286 A1 | 8/2007 | Nakayama |
| 2010/0129660 A1 * | 5/2010 | Nakayama ............ C04B 35/01 428/412 |
| 2011/0062436 A1 | 3/2011 | Yamazaki |
| 2011/0180763 A1 | 7/2011 | Utsuno |
| 2011/0315936 A1 | 12/2011 | Inoue |
| 2012/0012838 A1 | 1/2012 | Hosono |
| 2012/0068130 A1 | 3/2012 | Inoue |
| 2014/0145185 A1 * | 5/2014 | Ebata .................. C23C 14/08 257/43 |
| 2017/0047206 A1 * | 2/2017 | Nakayama ............ C04B 35/00 |

FOREIGN PATENT DOCUMENTS

| JP | 2010-219538 A1 | 9/2010 |
| JP | 2012-253372 A1 | 12/2012 |
| TW | 200732254 | 10/1995 |
| TW | 201307598 A1 | 2/2013 |
| WO | 03/014409 A1 | 2/2003 |
| WO | 2008/114588 A1 | 9/2008 |
| WO | 2009/008297 A1 | 1/2009 |
| WO | 2010/032422 A1 | 3/2010 |

(Continued)

OTHER PUBLICATIONS

Nakayama, Tokuyuki, et al., U.S. Appl. No. 15/306,910, filed Oct. 26, 2016.
N. Ueda, et al.; "New oxide phase with wide band gap and high electroconductivity, MgIn2O4;" Appl. Phys. Lett. 61; vol. 16; Oct. 19, 1992; pp. 1954-1955 (2 Sheets)/p. 4 of specification.
M. Orita, et al.; "New Transport Conductive Oxides with YbFe2O4 Structure;" Jpn. J. Appl. Phys.; vol. 34; 1995; pp. L1550-L1552 (3 Sheets)/p. 4 of specification
A. Takagi, et al.; "Carrier transport and electronic structure in amorphous oxide semiconductor, a-InGaZnO4;" Thin Solid Films; vol. 486; 2005; pp. 38-41 (4 Sheets)/p. 4 of specification.

(Continued)

*Primary Examiner* — Kevin M Picardat
(74) *Attorney, Agent, or Firm* — Kratz, Quintos & Hanson, LLP

(57) ABSTRACT

Provided are: a sintered oxide which achieves low carrier density and high carrier mobility when configured as an oxide semiconductor thin-film by using the sputtering method; and a sputtering target using the same. This sintered oxide contains indium, gallium and magnesium as oxides. It is preferable for the gallium content to be 0.20-0.45, inclusive, in terms of an atomic ratio (Ga/(In+Ga)), the magnesium content to be at least 0.0001 and less than 0.05 in terms of an atomic ratio (Mg/(In+Ga+Mg)), and the sintering to occur at 1,200-1,550° C., inclusive. An amorphous oxide semiconductor thin-film obtained by forming this sintered oxide as a sputtering target is capable of achieving a carrier density of less than $3.0 \times 10^{18}$ cm$^{-3}$, and a carrier mobility of 10 cm$^2$V$^{-1}$ sec$^{-1}$ or higher.

9 Claims, No Drawings

(56) References Cited

FOREIGN PATENT DOCUMENTS

WO   2013/005400 A1   1/2013

OTHER PUBLICATIONS

Office Action issued to TW Application No. 104116409, dated Dec. 22, 2015 (8 Sheets).
Office Action issued to TW Application No. 104116410, dated Jan. 26, 2016 (6 Sheets).
International Search Report for International Application No. PCT/JP2015/064527 dated Aug. 11, 2015.

* cited by examiner

OXIDE SINTERED BODY, SPUTTERING TARGET, AND OXIDE SEMICONDUCTOR THIN FILM OBTAINED USING SPUTTERING TARGET

TECHNICAL FIELD

The present invention relates to an oxide sintered body, a target, and an oxide semiconductor thin film obtained by using the target, and more particularly to an amorphous oxide semiconductor thin film which has low carrier density and high carrier mobility and contains indium, gallium, and magnesium, a sputtering target that is suitable for the formation of the amorphous oxide semiconductor thin film and contains indium, gallium, and magnesium, and an oxide sintered body that is suitable for obtaining the sputtering target and contains indium, gallium, and magnesium.

BACKGROUND ART

Thin film transistors (TFTs) are a type of field effect transistors (hereinafter referred to as FETs). TFTs are three-terminal elements having a gate terminal, a source terminal, and a drain terminal in the basic structure. TFTs are active elements having a function of switching the current between the source terminal and the drain terminal so that a semiconductor thin film deposited on a substrate is used as a channel layer in which electrons or holes move and a voltage is applied to the gate terminal to control the current flowing in the channel layer. TFTs are electronic devices that are most widely used these days in practical application. Typical applications of TFTs include liquid-crystal driving elements.

Currently, most widely used TFTs are metal-insulator-semiconductor-FETs (MIS-FETs) in which a polycrystalline silicon film or an amorphous silicon film is used as a channel layer material. MIS-FETs including silicon are opaque to visible light and thus fail to form transparent circuits. Therefore, when MIS-FETs are used as switching elements for driving liquid crystals in liquid crystal displays, the aperture ratio of a display pixel in the devices is small.

Due to the recent need for high-resolution liquid crystals, switching elements for driving liquid crystals now require high-speed driving. In order to achieve high-speed driving, a semiconductor thin film in which the mobility of electrons or holes is higher than that in at least amorphous silicon needs to be used as a channel layer.

Under such circumstances, Patent Document 1 proposes a transparent semi-insulating amorphous oxide thin film which is a transparent amorphous oxide thin film deposited by vapor deposition and containing elements of In, Ga, Zn, and O. The composition of the oxide is $InGaO_3(ZnO)_m$ (m is a natural number less than 6) when the oxide is crystallized. The transparent semi-insulating amorphous oxide thin film is a semi-insulating thin film having a carrier mobility (also referred to as carrier electron mobility) of more than 1 $cm^2$ $V^{-1}$ $sec^{-1}$ and a carrier density (also referred to as carrier electron density) of $10^{16}$ $cm^{-3}$ or less without doping with an impurity ion. Patent Document 1 also proposes a thin film transistor in which the transparent semi-insulating amorphous oxide thin film is used as a channel layer.

However, as proposed in Patent Document 1, the transparent amorphous oxide thin film (a-IGZO film) containing elements of In, Ga, Zn, and O and deposited by any method of vapor deposition method selected from sputtering and pulsed laser deposition method has an electron carrier mobility in the range of only about from 1 to 10 $cm^2$ $V^{-1}$ $sec^{-1}$, and thus it is pointed out that this carrier mobility is insufficient when the transparent amorphous oxide thin film is formed into a channel layer in TFTs.

In addition, in Patent Document 2, a sputtering target containing a sintered body which contains In, Ga, and Mg and one or more kinds of compounds selected from a compound represented by $In_2O_3$, a compound represented by $In(GaMg)O_4$, a compound represented by $MgGa_2O_4$, and a compound represented by $In_2MgO_4$ has been proposed.

However, the target disclosed in Patent Document 2 includes a phase such as $Ga_2MgO_4$, which has low conductivity so as to cause arcing, and thus there is a problem that abnormal discharge is caused.

Therefore, it is the present situation that the development of an oxide sintered body or target for an oxide conductive film which does not include these phases that cause arcing is difficult.

Patent Document 1: Japanese Unexamined Patent Application, Publication No. 2010-219538
Patent Document 2: PCT International Publication No. WO2013/005400
Patent Document 3: PCT International Publication No. WO2003/014409
Non-Patent Document 1: N. Ueda and six others, "New oxide phase with wide band gap and high electroconductivity, $MgIn_2O_4$". Appl. Phys. Lett. 61 (16), 19, Oct. 1992, p. 1954-1955
Non-Patent Document 2: M. Orita and three others, "New Transparent Conductive Oxides with $YbFe_2O_4$ Structure", JJAP, 34, L1550
Non-Patent Document 3: A. Takagi, K. Nomura, H. Ohta, H. Yanagi, T. Kamiya, M. Hirano, and H. Hosono, Thin Solid Films 486, 38 (2005)

DISCLOSURE OF THE INVENTION

Problems to be Solved by the Invention

An object of the present invention is to provide a sputtering target that allows an amorphous oxide semiconductor thin film to have low carrier density, an oxide sintered body most suitable for obtaining the sputtering target, and an oxide semiconductor thin film that is obtained by using the sputtering target and has low carrier density and high carrier mobility.

Means for Solving the Problems

The inventors of the present invention have newly found that an oxide semiconductor thin film formed as described below has a carrier mobility of 10 $cm^2$ $V^{-1}$ $sec^{-1}$ or more. The oxide semiconductor thin film is formed by using an oxide sintered body obtained as follows: adding a small amount of magnesium to an oxide sintered body containing gallium as an oxide so that the indium and gallium Ga/(In+Ga) ratio is 0.20 or more and 0.45 or less; and sintering the oxide sintered body. Specifically, the amount of magnesium added is 0.0001 or more and less than 0.05 in terms of Mg/(In+Ga+Mg) ratio. The oxide sintered body thus sintered is substantially composed of; an $In_2O_3$ phase having a bixbyite-type structure; and a $GaInO_3$ phase having a β-$Ga_2O_3$-type structure as a formed phase other than the $In_2O_3$ phase, or a $GaInO_3$ phase having a β-$Ga_2O_3$-type structure and a $(Ga, In)_2O_3$ phase as a formed phase other than the $In_2O_3$ phase.

That is, in a first embodiment of the present invention, an oxide sintered body includes indium, gallium, and magnesium as oxides. The gallium content is 0.20 or more and 0.45 or less in terms of Ga/(In+Ga) atomic ratio. The magnesium content is 0.0001 or more and less than 0.05 in terms of Mg/(In+Ga+Mg) atomic ratio. The oxide sintered body is composed of; an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase; and is substantially free of an $In(GaMg)O_4$ phase, an $MgGa_2O_4$ phase, an $In_2MgO_4$ phase, and a $Ga_2O_3$ phase.

In a second embodiment of the present invention, the magnesium content is 0.01 or more and 0.03 or less in terms of Mg/(In+Ga+Mg) atomic ratio in the oxide sintered body according to the first embodiment.

In a third embodiment of the present invention, the gallium content is 0.20 or more and 0.30 or less in terms of Ga/(In+Ga) atomic ratio in the oxide sintered body according to the first or second embodiment.

In a fourth embodiment of the present invention, the oxide sintered body according to any one of the first to third embodiments is substantially free of positive divalent elements other than magnesium and positive trivalent to positive hexavalent elements other than indium and gallium.

In a fifth embodiment of the present invention, an X-ray diffraction peak intensity ratio of the $GaInO_3$ phase having a $\beta$-$Ga_2O_3$-type structure defined by formula 1 below is in the range of 2% or more and 80% or less in the oxide sintered body according to any one of the first to fourth embodiments:

$$100 \times I[GaInO_3\ phase(111)]/\{I[In_2O_3\ phase(400)]+I[GaInO_3\ phase(111)]\}[\%] \quad \text{Formula 1}$$

In a sixth embodiment of the present invention, a sputtering target is obtained by machining the oxide sintered body according to any one of the first to fifth embodiments.

In a seventh embodiment of the present invention, an amorphous oxide semiconductor thin film is obtained by film deposition on a substrate by sputtering using the sputtering target according to the sixth embodiment, followed by heating.

In an eighth embodiment of the present invention, the oxide semiconductor thin film according to the seventh embodiment has a carrier mobility of 10 $cm^2\ V^{-1}\ sec^{-1}$ or more.

In a ninth embodiment of the present invention, the oxide semiconductor thin film according to the seventh or eighth embodiment has a carrier density of less than $3.0 \times 10^{18}\ cm^{-3}$.

Effects of the Invention

The oxide sintered body of the present invention which contains indium and gallium as oxides and magnesium at 0.0001 or more and less than 0.05 in terms of Mg/(In+Ga+Mg) atomic ratio can provide an amorphous oxide semiconductor thin film of the present invention through sputter deposition and subsequent heating when the oxide sintered body is used, for example, as a sputtering target. Since the amorphous oxide semiconductor thin film is free of microcrystals and the like and has sufficient amorphous properties because of the effect of predetermined amounts of gallium and magnesium in the thin film, it can be patterned into a desired shape by wet etching. In addition, by the same effect, the amorphous oxide semiconductor thin film of the present invention has low carrier density and high carrier mobility. The amorphous oxide semiconductor thin film of the present invention thus can be used as a channel layer in TFTs. Therefore, the oxide sintered body, the target, and the oxide semiconductor thin film obtained by using the target of the present invention are industrially very useful.

PREFERRED MODE FOR CARRYING OUT THE INVENTION

An oxide sintered body, a sputtering target, and a semiconductor thin film obtained by using the target in the present invention will be described below in detail.

An oxide sintered body of the present invention contains indium, gallium, and magnesium as oxides. In the oxide sintered body, the gallium content is 0.20 or more and 0.45 or less in terms of Ga/(In+Ga) atomic ratio, and the magnesium content is 0.0001 or more and less than 0.05 in terms of Mg/(In+Ga+Mg) atomic ratio.

The gallium content, in terms of Ga/(In+Ga) atomic ratio, is 0.20 or more and 0.45 or less and more preferably 0.20 or more and 0.30 or less. Gallium has an effect of reducing the amount of oxygen deficiency in the amorphous oxide semiconductor thin film of the present invention because gallium has a high bonding strength with oxygen. When the gallium content is less than 0.20 in terms of Ga/(In+Ga) atomic ratio, this effect is not sufficiently obtained. On the other hand, when the gallium content is more than 0.45, it is impossible to obtain sufficiently high carrier mobility as an oxide semiconductor thin film.

The oxide sintered body of the present invention contains magnesium in addition to indium and gallium, which are in the composition ranges defined as described above. Magnesium concentration is 0.0001 or more and less than 0.05 and preferably 0.01 or more and 0.03 or less in terms of Mg/(In+Ga+Mg) atomic ratio.

Doping the oxide sintered body of the present invention with magnesium in this range reduces the carrier density because magnesium doping has an effect of neutralizing electrons generated mainly by oxygen defects. When the amorphous oxide semiconductor thin film of the present invention is used in TFTs, the on/off ratio of TFTs can be increased.

It is preferred that the oxide sintered body of the present invention be substantially free of M, which are positive divalent elements other than magnesium and positive trivalent to positive hexavalent elements other than indium and gallium. The term "substantially free of M" as used herein means that the content of each M, in terms of M/(In+Ga+M) atomic ratio, is 500 ppm or less, preferably 200 ppm or less, and more preferably 100 ppm or less. Specific examples of the element M include positive divalent elements, such as Cu, Ni, Co, Zn, Ca, Sr, and Pb; positive trivalent elements, such as Al, Y, Sc, B, and lanthanoids; positive tetravalent elements, such as Sn, Ge, Ti, Si, Zr, Hf, C, and Ce; positive pentavalent elements, such as Nb and Ta; and positive hexavalent elements, such as W and Mo.

1. Structure of Oxide Sintered Body

The oxide sintered body of the present invention is composed of; an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase. Nodules are generated when the oxide sintered body is composed only of an $In_2O_3$ phase, for example, in the same manner as in Comparative Example 11 of Patent Document 3 (PCT International Publication No. WO2003/014409) regardless of the inclusion of Mg. On the other hand, an In phase, an $MgGa_2O_4$ phase, and an $In_2MgO_4$ phase are all phases having a high resistance so as to be a cause of arcing or nodules. The $In_2MgO_4$ phase has a specific resistance of about $10^{-2}$ Ω·cm (Non-Patent Document 1) so as to have an electrical resistance higher by one to two orders than that of the $In_2O_3$ phase or the $GaInO_3$ phase, and thus nodules are likely to be generated as the $In_2MgO_4$ phase is likely to remain by sputter deposition. The $In(GaMg)O_4$ phase has a higher specific resistance of about $10^0$ Ω·cm (Non-Patent Document 2) so as to be a cause of the nodule generation. The $MgGa_2O_4$ phase has an even higher specific resistance since it does not contain In so as to be a cause of arcing. In addition, in an oxide semiconductor thin film obtained by sputter deposition using an oxide sintered body in which these phases are formed, the carrier mobility tends to decrease.

Gallium and magnesium are dissolved in the $In_2O_3$ phase. In addition, gallium makes up the $GaInO_3$ phase or the $(Ga, In)_2O_3$ phase. When gallium and magnesium are dissolved in the $In_2O_3$ phase, gallium and magnesium substitute for indium, which is a trivalent cation, at the lattice positions. It is not preferred that gallium be less dissolved in the $In_2O_3$ phase because of unsuccessful sintering or the like, and as a result, a $Ga_2O_3$ phase having a $\beta$-$Ga_2O_3$-type structure is formed. Since the $Ga_2O_3$ phase has low conductivity, abnormal discharge arises.

The oxide sintered body of the present invention preferably includes only a $GaInO_3$ phase having a $\beta$-$Ga_2O_3$-type structure other than the $In_2O_3$ phase having a bixbyite-type structure, or a $GaInO_3$ phase having a $\beta$-$Ga_2O_3$-type structure and a $(Ga, In)_2O_3$ phase other than the $In_2O_3$ phase having a bixbyite-type structure, in the range in which the X-ray diffraction peak intensity ratio thereof defined by formula 1 below is 2% or more and 80% or less.

$$100 \times I[GaInO_3 \text{ phase}(111)]/\{I[In_2O_3 \text{ phase}(400)]+I[GaInO_3 \text{ phase}(111)]\}[\%] \quad \text{Formula 1}$$

(in Formula, I [$In_2O_3$ phase (400)] represents a (400) peak intensity of the $In_2O_3$ phase having a bixbyite-type structure, and I [$GaInO_3$ phase (111)] represents a (111) peak intensity of the $\beta$-$GaInO_3$ phase that is a composite oxide having a $\beta$-$Ga_2O_3$-type structure.)

2. Method for Producing Oxide Sintered Body

To produce the oxide sintered body of the present invention, a magnesium oxide powder and an oxide powder composed of an indium oxide powder and a gallium oxide powder are used as raw material powders.

In the process for producing the oxide sintered body of the present invention, these raw material powders are mixed and then compacted, and the compact is sintered by ordinary-pressure sintering. The formed phases in the structure of the oxide sintered body of the present invention strongly depend on the conditions in each step for producing the oxide sintered body, for example, the particle size of the raw material powders, the mixing conditions, and the sintering conditions.

The structure of the oxide sintered body of the present invention is preferably composed of; an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase in a desired ratio, and for this, the mean particle size of each raw material powder above is preferably 3 μm or less and more preferably 1.5 μm or less. As described above, the oxide sintered body includes, in addition to the $In_2O_3$ phase, the $GaInO_3$ phase having a $\beta$-$Ga_2O_3$-type structure or the $GaInO_3$ phase having a $\beta$-$Ga_2O_3$-type structure and the $(Ga, In)_2O_3$ phase, and thus the mean particle size of each raw material powder is preferably 1.5 μm or less in order to suppress excessive formation of these phases.

Indium oxide powder is a raw material for ITO (indium-tin oxide), and fine indium oxide powder having good sintering properties has been developed along with improvements in ITO. Since indium oxide powder has been continuously used in large quantities as a raw material for ITO, raw material powder having a mean particle size of 0.8 μm or less is available these days.

However, since the amount of gallium oxide powder or magnesium oxide powder used is still smaller than that of indium oxide powder used, it is difficult to obtain raw material powder having a mean particle size of 1.5 μm or less for gallium oxide powder or magnesium oxide powder. Therefore, when only coarse gallium oxide powder is available, the powder needs to be pulverized into particles having a mean particle size of 1.5 μm or less.

In the process for sintering the oxide sintered body of the present invention, ordinary-pressure sintering is preferably employed. Ordinary-pressure sintering is a simple and industrially advantageous method, and is also an economically preferable means.

When ordinary-pressure sintering is used, a compact is first produced as described above. Raw material powders are placed in a resin pot and mixed with a binder (for example, PVA) and the like by wet ball milling or the like. In the production of the oxide sintered body of the present invention, the ball mill mixing is preferably performed for 18 hours or longer in order to suppress excessive formation of the $GaInO_3$ phase having a $\beta$-$Ga_2O_3$-type structure other than the $In_2O_3$ phase, or the $GaInO_3$ phase having a $\beta$-$Ga_2O_3$-type structure and the $(Ga, In)_2O_3$ phase other than the $In_2O_3$ phase or to avoid formation of the $Ga_2O_3$ phase having a $\beta$-$Ga_2O_3$-type structure. In this case, hard $ZrO_2$ balls are used as mixing balls. After mixing, the slurry is taken out, filtered, dried, and granulated. Subsequently, the resultant granulated material is compacted under a pressure of about 9.8 MPa (0.1 ton/cm$^2$) to 294 MPa (3 ton/cm$^2$) by cold isostatic pressing to form a compact.

The sintering process by ordinary-pressure sintering is preferably preformed in an atmosphere containing oxygen. The volume fraction of oxygen in the atmosphere is preferably over 20%. In particular, when the volume fraction of oxygen is over 20%, the oxide sintered body is further densified. An excessive amount of oxygen in the atmosphere causes the surface of the compact to undergo sintering in advance during the early stage of sintering. Subsequently, sintering proceeds while the inside of the compact is reduced, and a highly dense oxide sintered body is finally obtained.

In an atmosphere free of oxygen, the surface of the compact does not undergo sintering and as a result, densification of the sintered body does not proceed. If oxygen is free, indium oxide decomposes particularly at about 900° C. to 1000° C. to form metal indium, which makes it difficult to obtain a desired oxide sintered body.

The temperature range of ordinary-pressure sintering is preferably 1200° C. or higher and 1550° C. or lower, and more preferably sintering is performed at 1350° C. or higher and 1450° C. or lower in an atmosphere obtained by introducing oxygen gas into air in a sintering furnace. The sintering time is preferably 10 to 30 hours, and more preferably 15 to 25 hours.

When the sintering temperature is in the above range, and the oxide powder composed of the indium oxide powder and gallium oxide powder, and the magnesium oxide powder that are controlled to have a mean particle size of 1.5 µm or less are used as raw material powders, the oxide sintered body that is composed of; an $In_2O_3$ phase having a bixbyite-type structure; and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase is obtained.

At a sintering temperature lower than 1200° C., the sintering reaction does not sufficiently proceed and a disadvantage is caused that the density of the oxide sintered body is less than 6.4 g/cm$^3$. On the other hand, the formation of the $(Ga, In)_2O_3$ phase is remarkable when the sintering temperature is higher than 1550° C. The $(Ga, In)_2O_3$ phase has a higher electrical resistance than the $GaInO_3$ phase so as to cause a decrease in deposition rate. There is no problem when the sintering temperature is 1550° C. or lower, namely, the $(Ga, In)_2O_3$ phase is formed in a small amount. From this viewpoint, the sintering temperature is preferably 1200° C. or higher and 1550° C. or lower and more preferably 1350° C. or higher and 1450° C. or lower.

The temperature elevation rate until the sintering temperature is reached is preferably in the range of 0.2 to 5° C./min in order to cause debinding without forming cracks in the sintered body. As long as the temperature elevation rate is this range, the temperature may be increased to the sintering temperature in a combination of different temperature elevation rates as desired. In particular, it is effective to retain a temperature of 1100° C. or lower for a certain time in order to promote the dissolution of magnesium into the $In_2O_3$ phase. During the temperature elevation process, a particular temperature may be maintained for a certain time in order for debinding and sintering to proceed. The retention time is not particularly limited, but it is preferably 1 hour or longer and 10 hours or shorter. After sintering, oxygen introduction is stopped before cooling. The temperature is preferably decreased to 1000° C. at a temperature drop rate in the range of 0.2 to 5° C./min, and particularly 0.2° C./min or more and less than 1° C./min.

3. Target

The target of the present invention is obtained by cutting the above oxide sintered body into a predetermined size, grinding the surface thereof, and bonding the oxide sintered body to a backing plate. The target preferably has a flat shape, but may have a cylindrical shape. When a cylindrical target is used, it is preferred to suppress particle generation due to target rotation.

For use as a sputtering target, the density of the oxide sintered body of the present invention is preferably 6.4 g/cm$^3$ or more. It is not preferable that the density is less than 6.4 g/cm$^3$ since nodules are generated during use in mass production.

4. Oxide Semiconductor Thin Film and Method for Depositing Oxide Semiconductor Thin Film The amorphous oxide semiconductor thin film of the present invention is obtained as follows: once forming an amorphous thin film on a substrate by sputtering using the sputtering target; and heating the amorphous oxide thin film.

The sputtering target is formed from the oxide sintered body. The structure of the oxide sintered body, namely, the structure basically including an $In_2O_3$ phase having a bixbyite-type structure and a $GaInO_3$ phase having a $\beta$-$Ga_2O_3$-type structure, is important. To obtain the amorphous oxide semiconductor thin film according to the present invention, the amorphous oxide thin film needs to have a high crystallization temperature. The crystallization temperature is related to the structure of the oxide sintered body. That is, when the oxide sintered body includes not only an $In_2O_3$ phase having a bixbyite-type structure but also a $GaInO_3$ phase having a $\beta$-$Ga_2O_3$-type structure as the oxide sintered body used in the present invention, the oxide thin film obtained from this oxide sintered body after film deposition has a high crystallization temperature, namely, a crystallization temperature of preferably 250° C. or higher, more preferably 300° C. or higher, and even more preferably 350° C. or higher. That is, the oxide thin film is a stable amorphous film. In contrast, when the oxide sintered body includes only an $In_2O_3$ phase having a bixbyite-type structure, the oxide thin film after film deposition has a crystallization temperature as low as about 190° C. to 230° C. and is an unstable amorphous oxide thin film. Therefore, a heat treatment at about 250° C. causes crystallization of the oxide sintered body in some cases. Incidentally, in this case, microcrystals are already generated after film deposition, and the oxide sintered body is not amorphous any more, which makes wet-etching patterning difficult. This fact is well known for ordinary ITO (tin-doped indium oxide) transparent conducting films.

Ordinary sputtering is used in the process for forming the amorphous thin film. In particular, direct current (DC) sputtering is industrially advantageous because the thermal effects are minimized during film deposition and high-rate deposition is achieved. To form the oxide semiconductor thin film of the present invention by direct current sputtering, a gas mixture of an inert gas and oxygen, particularly a gas mixture of argon and oxygen, is preferably used as a sputtering gas. Sputtering is preferably performed in a chamber of a sputtering apparatus at an internal pressure of 0.1 to 1 Pa, particularly 0.2 to 0.8 Pa.

The substrate is typically a glass substrate and is preferably an alkali-free glass substrate. In addition, any resin sheet and resin film that withstands the temperature for the above process can be used.

In the process for forming the amorphous thin film, presputtering can be performed as follows: for example, after evacuation to $2 \times 10^4$ Pa or less, introducing a gas mixture of argon and oxygen until the gas pressure reaches 0.2 to 0.5 Pa; and generating a direct current plasma by applying direct current power so that the direct current power with respect to the area of the target, namely, the direct current power density, is in the range of about 1 to 7 W/cm$^2$. It is preferred that, after this presputtering for 5 to 30 minutes, the substrate position be corrected as desired and then sputter deposition be performed. In sputter deposition, the direct current power to be applied in an acceptable range is increased in order to increase the deposition rate.

The amorphous oxide semiconductor thin film of the present invention is obtained by depositing the amorphous thin film and then being subjected to a heat treatment. The conditions for heat treatment are a temperature lower than the crystallization temperature and an oxidizing atmosphere. The oxidizing atmosphere is preferably an atmosphere containing oxygen, ozone, water vapor, nitrogen oxides, or the like. The temperature for heat treatment is preferably 250 to 600° C., more preferably 300 to 550° C., and even more preferably 350 to 500° C. The time for heat treatment, namely, the time during which the temperature for heat treatment is maintained, is preferably 1 to 120 minutes and more preferably 5 to 60 minutes. In an example method until the heat treatment, an amorphous film is formed at a low temperature, for example, near room temperature, and the heat treatment is then performed in the temperature range lower than the crystallization temperature to obtain an amorphous oxide semiconductor thin film. In another method, the substrate is heated at a temperature lower than the crystallization temperature of the oxide thin film, preferably at between 100 and 300° C., and an amorphous oxide semiconductor thin film is deposited. Subsequently, the heat treatment may be further performed.

The composition of indium, gallium, and magnesium in the thin film before the heat treatment and the amorphous oxide semiconductor thin film after the heat treatment are approximately the same as the composition of those in the oxide sintered body of the present invention. That is, it is an amorphous oxide semiconductor thin film which contains indium and gallium as oxides and also contains magnesium. The gallium content is 0.20 or more and 0.45 or less in terms of Ga/(In+Ga) atomic ratio, and the magnesium content is 0.0001 or more and less than 0.05 in terms of Mg/(In+Ga+Mg) atomic ratio. The gallium content is more preferably 0.20 or more and 0.30 or less and even more preferably 0.25 or more and 0.30 or less in terms of Ga/(In+Ga) atomic ratio. In addition, the magnesium content is more preferably 0.01 or more and 0.03 or less in terms of Mg/(In+Ga+Mg) atomic ratio.

The amorphous oxide semiconductor thin film of the present invention is obtained by film deposition using, as a sputtering target or the like, an oxide sintered body having the composition and structure controlled as described above, followed by the heat treatment under the above appropriate conditions, and through this process, the carrier density decreases to $3 \times 10^{18}$ cm$^{-3}$ or less, more preferably the carrier density decreases to $1 \times 10^{18}$ cm$^{-3}$ or less, and particularly preferably to $8 \times 10^{17}$ cm$^{-3}$ or less. As represented by the amorphous oxide semiconductor thin film composed of indium, gallium, and zinc described in Non-Patent Document 3, an amorphous oxide semiconductor thin film containing indium in a great amount is in a degenerate state when the carrier density is $4 \times 10^{18}$ cm$^{-3}$ or more, and a TFT including such an amorphous oxide semiconductor thin film as a channel layer thus does not exhibit normally-off characteristics. Therefore, the amorphous oxide semiconductor thin film according to the present invention is advantageous in that the carrier density is controlled so that the TFT exhibits normally-off characteristics. In addition, the carrier mobility is 10 cm$^2$ V$^{-1}$ sec$^{-1}$ or more, and more preferably the carrier mobility is 15 cm$^2$ V$^{-1}$ sec$^{-1}$ or more.

The amorphous oxide semiconductor thin film of the present invention is subjected to micromachining, which is required in applications such as TFTs, by wet etching or dry etching. In general, an amorphous oxide thin film may be once formed at an appropriate substrate temperature selected from temperatures lower than the crystallization temperature, for example, temperatures from room temperature to 300° C., and then the amorphous oxide thin film may be micromachined by wet etching. Most weak acids can be used as an etchant, but a weak acid composed mainly of oxalic acid or hydrochloric acid is preferably used. For example, commercial products, such as ITO-06N available from Kanto Chemical Co., Inc., can be used. Dry etching may be selected depending on the structures of TFTs.

Although the thickness of the amorphous oxide semiconductor thin film of the present invention is not limited, the thickness is 10 to 500 nm, preferably 20 to 300 nm, and more preferably 30 to 100 nm. When the thickness is less than 10 nm, high carrier mobility is not achieved. On the other hand, when the thickness is more than 500 nm, it is disadvantageous in that a problem associated with productivity arises.

The mean transmittance of the amorphous oxide semiconductor thin film of the present invention in the visible range (400 to 800 nm) is preferably 80% or more, more preferably 85% or more, and still more preferably 90% or more. When the amorphous oxide semiconductor thin film of the present invention is used in a transparent TFT and the mean transmittance is less than 80%, the light extraction efficiency of, for example, liquid crystal elements and organic EL elements as transparent display devices decreases.

EXAMPLES

A more detailed description is provided below by way of Examples of the present invention, but the present invention is not limited by these Examples.

<Evaluation of Oxide Sintered Body>

The composition of metal elements in the obtained oxide sintered body was determined by ICP emission spectrometry. The formed phases were identified by a powder method with an X-ray diffractometer (available from Philips) using rejects of the obtained oxide sintered body.

<Evaluation of Basic Properties of Oxide Thin Film>

The composition of the obtained oxide thin film was determined by ICP emission spectrometry. The thickness of the oxide thin film was determined with a surface profilometer (available from KLA-Tencor Corporation). The deposition rate was calculated from the film thickness and the film deposition time. The carrier density and carrier mobility of the oxide thin film were determined with a Hall-effect measurement apparatus (available from TOYO Corporation). The formed phases in the film were identified by X-ray diffraction measurement.

(Production and Evaluation of Sintered Body)

An indium oxide powder, a gallium oxide powder, and a magnesium oxide powder were prepared as raw material powders so that each powder has a mean particle size of 1.5 μm or less. These raw material powders were prepared so as to obtain the Ga/(In+Ga) atomic ratio and the Mg/(In+Ga+Mg) atomic ratio of Examples and Comparative Examples shown in Table 1 and Table 2. The raw material powders were placed in a resin pot together with water and mixed by wet ball milling. At this time hard ZrO$_2$ balls were used, and the mixing time was 18 hours. After mixing, the slurry was taken out, filtered, dried, and granulated. The granulated material was compacted by cold isostatic pressing under a pressure of 3 ton/cm$^2$.

Next, the compact was sintered as described below. The compact was sintered at a sintering temperature of between 1000 and 1550° C. for 20 hours in an atmosphere obtained by introducing oxygen into air in a sintering furnace at a rate of 5 L/min per 0.1 m$^3$ furnace volume. At this time, the temperature was increased by 1° C./min, oxygen introduction was stopped during cooling after sintering, and the temperature was decreased to 1000° C. by 10° C./min.

The composition of the obtained oxide sintered body was analyzed by ICP emission spectrometry. As a result, it was confirmed that the composition of the metal elements substantially corresponds to the composition prepared at the time of mixing raw material powders in all Examples.

Next, the phases of the oxide sintered body were identified by X-ray diffraction measurement, and as a result, the diffraction peak attributed to an In$_2$O$_3$ phase having a bixbyite-type structure, the diffraction peaks attributed to an In$_2$O$_3$ phase having a bixbyite-type structure, a GaInO$_3$ phase having a β-Ga$_2$O$_3$-type structure, or a (Ga, In)$_2$O$_3$ phase were confirmed as shown in Table 1.

Incidentally, in the case of including a GaInO$_3$ phase having a β-Ga$_2$O$_3$-type structure, the X-ray diffraction peak intensity ratio of the GaInO$_3$ phase having a β-Ga$_2$O$_3$-type structure defined by Formula 1 below is shown in Table 1.

$$100 \times I[\text{GaInO}_3\text{ phase}(111)]/\{I[\text{In}_2\text{O}_3\text{ phase}(400)]+I[\text{GaInO}_3\text{ phase}(111)]\}[\%] \quad \text{Formula 1}$$

appropriate oxygen ratio, which depends on the gallium content in each target. The gas pressure was controlled to 0.6 Pa. A direct current plasma was generated by applying a direct current power of 300 W (1.64 W/cm$^2$). After presput-

TABLE 1

| | Ga/(In + Ga) Atomic ratio | Mg/(In + Ga + Mg) Atomic ratio | Sintering temperature (° C.) | Density of sintered body (g/cm$^3$) | GaInO$_3$ (111) Peak intensity ratio | Structure of sintered body |
|---|---|---|---|---|---|---|
| Comparative Example 1 | 0.15 | 0.03 | 1400 | 6.83 | 29 | In$_2$O$_3$/GaInO$_3$ |
| Example 1 | 0.20 | 0.0001 | 1400 | 6.87 | 30 | In$_2$O$_3$/GaInO$_3$ |
| Example 2 | 0.20 | 0.01 | 1400 | 6.82 | 33 | In$_2$O$_3$/GaInO$_3$ |
| Example 3 | 0.20 | 0.01 | 1200 | 6.70 | 28 | In$_2$O$_3$/GaInO$_3$ |
| Example 4 | 0.20 | 0.03 | 1400 | 6.79 | 40 | In$_2$O$_3$/GaInO$_3$ |
| Example 5 | 0.20 | 0.03 | 1550 | 6.74 | 28 | In$_2$O$_3$/GaInO$_3$/(Ga, In)$_2$O$_3$ |
| Comparative Example 2 | 0.20 | 0.05 | 1400 | 6.33 | — | In$_2$O$_3$/In(GaMg)O$_4$ |
| Example 6 | 0.25 | 0.01 | 1400 | 6.73 | 42 | In$_2$O$_3$/GaInO$_3$ |
| Example 7 | 0.25 | 0.04 | 1400 | 6.62 | 48 | In$_2$O$_3$/GaInO$_3$ |
| Example 8 | 0.30 | 0.01 | 1350 | 6.65 | 50 | In$_2$O$_3$/GaInO$_3$ |
| Example 9 | 0.45 | 0.0001 | 1400 | 6.43 | 71 | In$_2$O$_3$/GaInO$_3$ |
| Example 10 | 0.45 | 0.01 | 1400 | 6.43 | 73 | In$_2$O$_3$/GaInO$_3$ |
| Example 11 | 0.45 | 0.03 | 1400 | 6.41 | 80 | In$_2$O$_3$/GaInO$_3$ |
| Comparative Example 3 | 0.45 | 0.05 | 1400 | 6.24 | — | In$_2$O$_3$/In(GaMg)O$_4$/MgGa$_2$O$_4$ |
| Comparative Example 4 | 0.45 | 0.08 | 1400 | 6.10 | — | In$_2$O$_3$/In(GaMg)O$_4$/MgGa$_2$O$_4$ |
| Comparative Example 5 | 0.80 | 0.05 | 1400 | 5.81 | — | In$_2$O$_3$/In(GaMg)O$_4$/Ga$_2$O$_3$ |

The oxide sintered body was machined to a size of 152 mm in diameter and 5 mm in thickness. The sputtering surface was ground with a cup grinding wheel so that the maximum height Rz was 3.0 μm or less. The machined oxide sintered body was bonded to an oxygen-free copper backing plate by using metal indium to provide a sputtering target.
(Evaluation on Sputter Deposition)

Film deposition by direct current sputtering was performed at room temperature without heating the substrate by using the sputtering targets of Examples and Comparative Examples and an alkali-free glass substrate (Eagle XG manufactured by Corning Incorporated). The sputtering target was attached to a cathode of a direct current magnetron sputtering apparatus (available from Tokki Corporation) having a direct current power supply with no arcing control function. At this time, the target-substrate (holder) distance was fixed at 60 mm. After evacuation to 1×10$^{-4}$ Pa or less, a gas mixture of argon and oxygen was introduced at an tering for 10 minutes, the substrate was placed directly above the sputtering target, namely, in the stationary opposing position, and an oxide thin film having a thickness of 50 nm was deposited. The composition of the obtained oxide thin film was confirmed to be substantially the same as that of the target. As a result of X-ray diffraction measurement, the oxide thin film was confirmed to be amorphous. The obtained amorphous oxide thin film was subjected to a heat treatment at 250 to 400° C. within 30 minutes in air by using a RTA (Rapid Thermal Annealing) apparatus. It was confirmed that the oxide thin film after the heat treatment was amorphous from the result of X-ray diffraction measurement, and the main peak was In$_2$O$_3$ (111). The Hall-effect measurement was performed on the obtained amorphous oxide semiconductor thin films to obtain the carrier density and the carrier mobility. The obtained evaluation results are summarized in Table 2.

TABLE 2

| | Ga/(In + Ga) Atomic ratio | Mg/(In + Ga + Mg) Atomic ratio | Sintering temperature (° C.) | Heat treatment temperature (° C.) | Film thickness (nm) | Crystal structure of thin film | Carrier density (×10$^{17}$ cm$^{-3}$) | Carrier mobility (cm$^2$/V · s) |
|---|---|---|---|---|---|---|---|---|
| Comparative Example 1 | 0.15 | 0.03 | 1400 | 250 | 50 | Amorphous | 42 | 27.0 |
| Example 1 | 0.20 | 0.0001 | 1400 | 350 | 50 | Amorphous | 26 | 26.3 |
| Example 2 | 0.20 | 0.01 | 1400 | 350 | 50 | Amorphous | 8.9 | 24.3 |
| Example 3 | 0.20 | 0.01 | 1200 | 350 | 50 | Amorphous | 9.6 | 22.7 |
| Example 4 | 0.20 | 0.03 | 1400 | 350 | 50 | Amorphous | 5.4 | 22.4 |
| Example 5 | 0.20 | 0.03 | 1550 | 350 | 50 | Amorphous | 5.6 | 21.0 |
| Comparative Example 2 | 0.20 | 0.05 | 1400 | 350 | 50 | Amorphous | 4.9 | 17.4 |
| Example 6 | 0.25 | 0.01 | 1400 | 350 | 50 | Amorphous | 4.4 | 21.0 |
| Example 7 | 0.25 | 0.04 | 1400 | 350 | 50 | Amorphous | 1.8 | 18.8 |

TABLE 2-continued

|  | Ga/(In + Ga) Atomic ratio | Mg/(In + Ga + Mg) Atomic ratio | Sintering temperature (° C.) | Heat treatment temperature (° C.) | Film thickness (nm) | Crystal structure of thin film | Carrier density ($\times 10^{17}$ cm$^{-3}$) | Carrier mobility (cm$^2$/V · s) |
|---|---|---|---|---|---|---|---|---|
| Example 8 | 0.30 | 0.01 | 1350 | 350 | 50 | Amorphous | 2.7 | 20.2 |
| Example 9 | 0.45 | 0.0001 | 1400 | 400 | 50 | Amorphous | 0.35 | 14.5 |
| Example 10 | 0.45 | 0.01 | 1400 | 400 | 50 | Amorphous | 0.23 | 13.2 |
| Example 11 | 0.45 | 0.03 | 1400 | 400 | 50 | Amorphous | 0.11 | 11.3 |
| Comparative Example 3 | 0.45 | 0.05 | 1400 | 400 | 50 | Amorphous | 0.12 | 6.6 |
| Comparative Example 4 | 0.45 | 0.08 | 1400 | 400 | 50 | Amorphous | Unmeasurable | Unmeasurable |
| Comparative Example 5 | 0.80 | 0.05 | 1400 | — | — | — | Unable to deposit film | Unable to deposit film |

(Evaluation on Nodule Generation)

The evaluation on the nodule generation due to the sputter deposition simulating mass production was carried out for the sputtering targets of Examples 2, 10 and Comparative Example 2. A load-lock-type pass-type magnetron sputtering apparatus equipped with a direct current power supply with no arcing suppression function (available from ULVAC Technologies, Inc.) was used as the sputtering apparatus. A square-shaped target having 5 inches in height and 15 inches in width was used as the target. After evacuation of the sputtering chamber for the evaluation on sputter deposition to $7 \times 10^{-5}$ Pa or less, a gas mixture of argon and oxygen was introduced into the sputtering chamber at an appropriate oxygen ratio, which depended on the gallium content in each target, and the gas pressure was controlled to 0.6 Pa. The reason for selecting the sputtering gas under such conditions is because it is impossible to perform an appropriate evaluation when the degree of vacuum in the sputtering chamber is higher than $1 \times 10^{-4}$ Pa so that the moisture pressure in the chamber is high or a hydrogen gas is added. As it is well known in the ITO or the like, when H$^+$ derived from moisture or the hydrogen gas is incorporated into the film, the crystallization temperature of the film is increased and the film which adheres to the target non-erosion portion is likely to be amorphous. As a result, the film stress decreases and thus the target non-erosion portion is less likely to peel off and the nodules are less likely to be generated. The direct current power was set to 2500 W (direct current power density: 5.17 W/cm$^2$) in consideration of that the direct current power density employed in mass production is generally about 3 to 6 W/cm$^2$.

As the evaluation on the nodule generation, the presence or absence of the nodule generation was evaluated by observing the target surface after continuous sputtering discharge at 50 kWh under the above conditions.

[Evaluation]

The results in Table 1 indicate that, when the gallium content is 0.20 or more and 0.45 or less in terms of Ga/(In+Ga) atomic ratio and the magnesium content is 0.0001 or more and less than 0.05 in terms of Mg/(In+Ga+Mg) atomic ratio in Examples 1 to 11, the oxide sintered bodies are composed of; an In$_2$O$_3$ phase having a bixbyite-type structure; and a GaInO$_3$ phase having a β-Ga$_2$O$_3$-type structure as a formed phase other than the In$_2$O$_3$ phase, or a GaInO$_3$ phase having a β-Ga$_2$O$_3$-type structure and a (Ga, In)$_2$O$_3$ phase as a formed phase other than the In$_2$O$_3$ phase.

In contrast, the magnesium content is 0.05 or more in terms of Mg/(In+Ga+Mg) atomic ratio in the oxide sintered bodies of Comparative Examples 2 to 4, thus the formed phases other than the In$_2$O$_3$ phase having a bixbyite-type structure, the GaInO$_3$ phase having a β-Ga$_2$O$_3$-type structure, and the (Ga, In)$_2$O$_3$ phase include an In(GaMg)O$_4$ phase, an MgGa$_2$O$_4$ phase, and a Ga$_2$O$_3$ phase which cause the generation of nodules and arcing, and the desired oxide sintered body of the present invention is not obtained. Incidentally, arcing more frequently occurred in the sintered bodies of Comparative Examples 3 and 4 as compared to Examples 1 to 11 or other Comparative Examples 1 and 2 since the sintered bodies of Comparative Examples 3 and 4 include an MgGa$_2$O$_4$ phase. In addition, a Ga$_2$O$_3$ phase was formed in a great amount in the sintered body of Comparative Example 5 so that it was not able to perform film deposition.

In the evaluation on the nodule generation of Examples 2 and 10 and Comparative Example 2, the nodules generated were not observed in the targets of Examples 2 and 10, which were oxide sintered bodies of the present invention. On the other hand, a great number of generated nodules were observed in the target of Comparative Example 2. In Comparative Example 2, the fact that the density of the sintered body is low and an In(GaMg)O$_4$ phase is included in the oxide sintered body, which phase has a high electrical resistance and is likely to remain by sputtering, is believed as the cause.

In addition, the properties of the oxide semiconductor thin film which is an amorphous oxide semiconductor thin film containing indium, gallium, and magnesium as oxides and in which the gallium content is controlled to 0.20 or more and 0.45 or less in terms of Ga/(In+Ga) atomic ratio and the magnesium content is controlled to 0.0001 or more and less than 0.05 in terms of Mg/(In+Ga+Mg) atomic ratio are shown in Table 2.

The oxide semiconductor thin films of Examples are found to have a carrier density of less than $3.0 \times 10^{18}$ cm$^{-3}$ and a carrier mobility of 10 cm$^2$ V$^{-1}$ sec$^{-1}$ or more.

Among them, the oxide semiconductor thin films of Examples 2 to 6, and 8 in which the gallium content is 0.20 or more and 0.30 or less in terms of Ga/(In+Ga) atomic ratio and the magnesium content is 0.01 or more and 0.03 or less in terms of Mg/(In+Ga+Mg) atomic ratio exhibit good properties, a carrier density of $1.0 \times 10^{18}$ cm$^{-3}$ or less and a carrier mobility of 20 cm$^2$ V$^{-1}$ sec$^{-1}$ or more.

In contrast, in the oxide semiconductor thin films of Comparative Example 3, the magnesium content is 0.05 or more in terms of Mg/(In+Ga+Mg) atomic ratio and the carrier mobility is below 10 cm$^2$ V$^{-1}$ sec$^{-1}$, and thus the desired oxide semiconductor thin film of the present invention is not obtained.

The invention claimed is:

1. An oxide sintered body comprising indium, gallium, and magnesium as oxides, wherein a gallium content is 0.20 or more and 0.45 or less in terms of Ga/(In+Ga) atomic ratio, a magnesium content is 0.0001 or more and less than 0.05 in terms of Mg/(In+Ga+Mg) atomic ratio, and the oxide sintered body comprises;

an $In_2O_3$ phase having a bixbyite-type structure;

and a $GaInO_3$ phase having a $\beta$-$Ga_2O_3$-type structure as a formed phase other than the $In_2O_3$ phase, or a $GaInO_3$ phase having a $\beta$-$Ga_2O_3$-type structure and a $(Ga, In)_2O_3$ phase as a formed phase other than the $In_2O_3$ phase;

and is free of an $In(GaMg)O_4$ phase, an $MgGa_2O_4$ phase, an $In_2MgO_4$ phase, and a $Ga_2O_3$ phase.

2. The oxide sintered body according to claim 1, wherein the magnesium content is 0.01 or more and 0.03 or less in terms of Mg/(In+Ga+Mg) atomic ratio.

3. The oxide sintered body according to claim 1, wherein the gallium content is 0.20 or more and 0.30 or less in terms of Ga/(In+Ga) atomic ratio.

4. The oxide sintered body according to claim 1, wherein the oxide sintered body is substantially free of positive divalent elements other than magnesium and positive trivalent to positive hexavalent elements other than indium and gallium.

5. The oxide sintered body according to claim 1, wherein an X-ray diffraction peak intensity ratio of the $GaInO_3$ phase having a $\beta$-$Ga_2O_3$-type structure defined by formula 1 below is in the range of 2% or more and 80% or less:

100×I [$GaInO_3$ phase (111)]/{I [$In_2O_3$ phase (400)]+I [$GaInO_3$ phase (111)]}[%] . . . Formula 1 (in Formula 1, I [$In_2O_3$ phase (400)] represents a (400) peak intensity of the $In_2O_3$ phase having a bixbyite-type structure, and I [$GaInO_3$ phase (111)] represents a (111) peak intensity of the $\beta$-$GaInO_3$ phase that is a composite oxide having a $\beta$-$Ga_2O_3$-type structure).

6. A sputtering target obtained by machining the oxide sintered body according to claim 1.

7. An amorphous oxide semiconductor thin film obtained by film deposition on a substrate by sputtering using the sputtering target according to claim 6, followed by heating.

8. The oxide semiconductor thin film according to claim 7, wherein the oxide semiconductor thin film has a carrier mobility of 10 cm$^2$ V$^{-1}$ sec$^{-1}$ or more.

9. The oxide semiconductor thin film according to claim 7, wherein the oxide semiconductor thin film has a carrier density of less than $3.0 \times 10^{18}$ cm$^{-3}$.

* * * * *